(12) United States Patent
Jeong

(10) Patent No.: US 8,076,201 B2
(45) Date of Patent: Dec. 13, 2011

(54) METHOD OF MANUFACTURING FLASH MEMORY DEVICE

(75) Inventor: Hee Don Jeong, Gyeongsangnam-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/582,983

(22) Filed: Oct. 21, 2009

(65) Prior Publication Data
US 2010/0112799 A1    May 6, 2010

(30) Foreign Application Priority Data
Nov. 6, 2008 (KR) .................. 10-2008-0109756

(51) Int. Cl.
*H01L 21/336* (2006.01)
(52) U.S. Cl. ........ 438/267; 438/288; 438/591; 438/596; 257/E21.21; 257/E21.679
(58) Field of Classification Search .................. 438/176, 438/288; 257/E21.18
See application file for complete search history.

(56) References Cited

U.S. PATENT DOCUMENTS
2004/0197995 A1*  10/2004  Lee et al. ............... 438/257
* cited by examiner

*Primary Examiner* — Cheung Lee
(74) *Attorney, Agent, or Firm* — Saliwanchik, Lloyd & Eisenschenk

(57) ABSTRACT

A method of manufacturing a flash memory device according to an embodiment includes forming a second oxide layer pattern having a mask pattern buried therein on a first nitride layer pattern and a first oxide layer stack on a semiconductor substrate; forming first polysilicon patterns at sidewalls of the buried mask pattern; removing portions of the first oxide layer, the first nitride layer pattern, and the second oxide layer pattern to form a third oxide layer pattern, a second nitride layer pattern, and a fourth oxide layer pattern at lower portions of the first polysilicon patterns and the mask pattern; forming a fifth oxide layer pattern surrounding each of the first polysilicon patterns; forming second polysilicon patterns on sidewalls of the fifth oxide layer pattern; and removing the mask pattern and parts of the third oxide layer pattern and the second nitride layer pattern between the first polysilicon patterns.

11 Claims, 7 Drawing Sheets

METHOD OF MANUFACTURING FLASH MEMORY DEVICE

This application claims the benefit under 35 U.S.C. §119 of Korean Application No. 10-2008-0109756, filed Nov. 6, 2008, which is hereby incorporated by reference in its entirety.

BACKGROUND

The present disclosure relates to a method of manufacturing a flash memory device.

A flash memory device is a nonvolatile memory device that does not lose data stored therein even if power is turned off In addition, flash memory can record, read, and delete data at a relatively high speed.

Accordingly, flash memory devices are widely used for the Bios of a personal computer (PC), a set-top box, a printer, and a network server in order to store data. Recently, flash memory devices are extensively used for digital cameras and portable phones.

In such a flash memory device, a semiconductor device having a SONOS (Silicon-Oxide-Nitride-Oxide-Silicon) structure is mainly used.

Different from a flash memory device having a floating gate including polycrystalline silicon, the SONOS memory device is a charge-trap type device, in which gate voltage is applied to charges in order for the charges to pass through a thin oxide layer formed on silicon, so that the charges are injected into or released from a trap formed in a silicon nitride layer.

BRIEF SUMMARY

According to an embodiment, a method of manufacturing a flash memory device is provided that includes forming a first oxide layer on a semiconductor substrate, forming and a first nitride layer pattern on the first oxide layer, and forming a second oxide layer having a mask pattern buried therein on the first nitride layer pattern; forming a first polysilicon pattern on a sidewall of the mask pattern that is surrounded by the second oxide layer; performing a first etching process with respect to the semiconductor substrate having the first polysilicon pattern such that a third oxide layer pattern, a second nitride layer pattern and a fourth oxide layer pattern remain at lower portions of the first polysilicon pattern and the mask pattern, the third oxide layer pattern being a portion of the first oxide layer, the second nitride layer pattern being a portion of the first nitride layer pattern, and the fourth oxide layer pattern being a portion of the second oxide layer; forming a fifth oxide layer pattern surrounding the first polysilicon pattern and forming a second polysilicon pattern on a sidewall of the fifth oxide layer pattern; and removing the mask pattern and parts of the third oxide layer pattern and the second nitride layer pattern that are at the lower portion of the mask pattern from the semiconductor substrate including the second polysilicon pattern.

DETAILED DESCRIPTION

Figure 1:
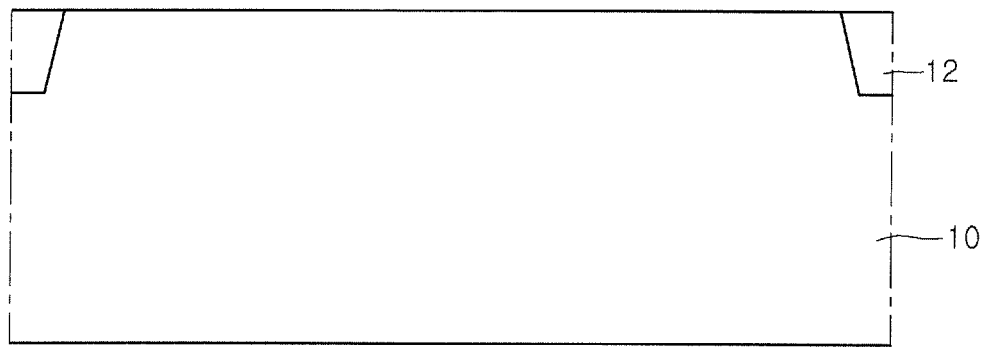
FIGS. 1 to 15 are cross-sectional views showing the procedure for manufacturing a flash memory device according to an embodiment.

Hereinafter, embodiments will be described in detail with reference to accompanying drawings.

In the description of an embodiment, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, and one or more intervening layers may also be present. Further, "on" or "under" positioning of each layer can be determined based on the drawing.

The thickness or size of layers shown in the drawings may be simplified or exaggerated for the purpose of clear explanation. In addition, the size of each element may be reduced or magnified from the real size thereof.

FIGS. 1 to 15 are cross-sectional views showing a procedure for manufacturing a flash memory device according to an embodiment.

As shown in FIG. 1, an isolation layer 12 is formed on a semiconductor substrate 10.

The isolation layer 12 may define an active area.

The isolation layer 12 may be formed by filling insulation material into a trench formed in the semiconductor substrate 10.

Figure 2:
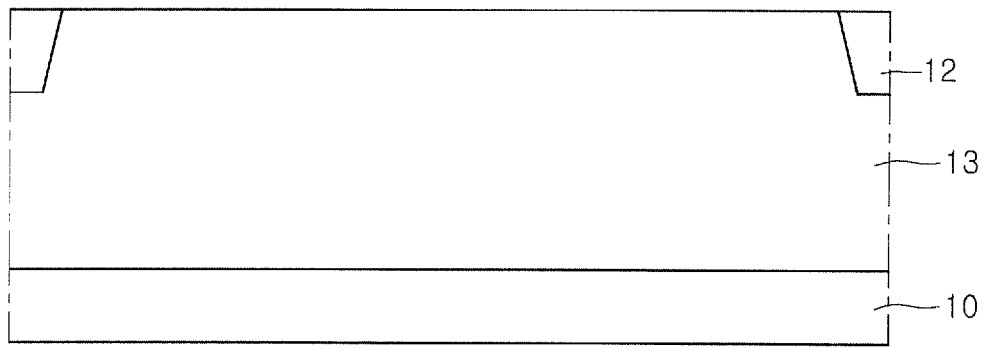

Then, as shown in FIG. 2, a well area 13 is formed on the semiconductor substrate 10 through a first ion implantation process.

A second ion implantation process can be performed with respect to the semiconductor substrate 10 having the well area 13 in order to adjust threshold voltage.

Figure 3:
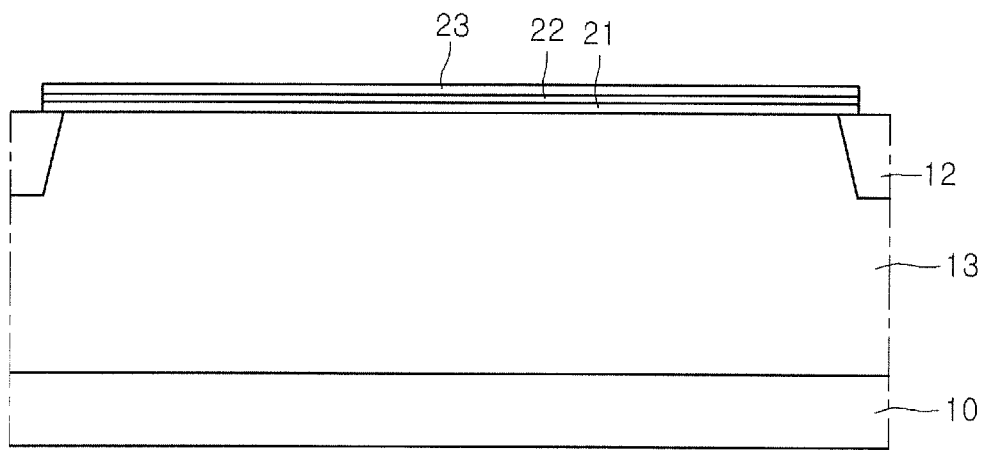

Then, as shown in FIG. 3, a first oxide layer 21, a first nitride layer pattern 22 and a second oxide layer pattern 23 are formed on the semiconductor substrate 10.

The first oxide layer 21 can be formed by performing a first heat treatment process with respect to the semiconductor substrate 10. The first heat treatment process can form the first oxide layer 21 in the form of $SiO_2$. The first oxide layer 21 may be formed to a thickness of about 50~80 Å on the semiconductor substrate 10. In addition, high-K material for the first oxide layer 21, such as $Al_2O_3$, can be deposited on the semiconductor substrate 10 through a CVD (chemical vapor deposition) or an ALD (atomic layer deposition). A nitride layer can be formed on the first oxide layer and a second oxide layer can be formed on the nitride layer.

The first nitride layer can be prepared in the form of $Si_xN_y$, (where x and y are natural numbers) with a thickness of about 70 to 100 Å through a CVD process, and the second oxide layer can be prepared in the form of $SiO_2$ through the CVD process.

The nitride layer pattern 22 and the second oxide layer pattern 23 can be formed by patterning the first nitride layer and the second oxide layer formed on the first oxide layer 21.

According to an embodiment the second oxide layer is patterned through a dry etching process, and the first nitride layer is patterned through a dry etching process or a wet etching process.

The first oxide layer 21 may serve as an etch stop layer when the first nitride layer is etched.

Figure 4:
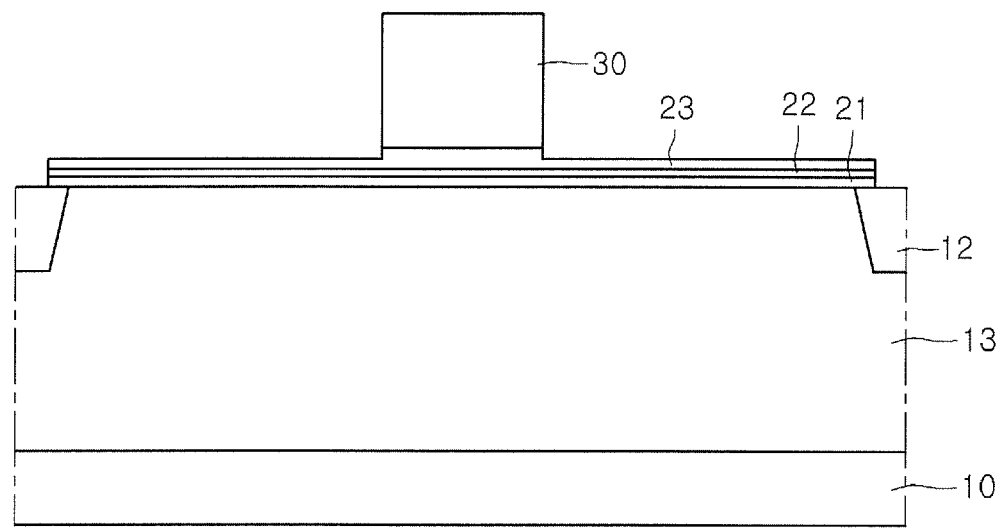

Next, as shown in FIG. 4, a mask pattern 30 is formed on the second oxide layer pattern 23.

The mask pattern 30 having a thickness of about 3000 to 4000 Å can be formed on the second oxide layer pattern 23 by using a nitride layer or a silicon oxide layer as a mask layer.

The mask pattern 30 can be formed by patterning the mask layer formed of the nitride layer or the silicon oxide layer through a photo process. A portion of the second oxide layer pattern 23 may be etched when patterning the mask layer.

Although the mask pattern 30 is described as being formed by using the nitride layer or the silicon oxide layer in the present embodiment, embodiments are not limited thereto. Various materials, which can serve as a mask when an etching process is performed with respect to a polysilicon layer, can be used for the mask pattern 30.

Figure 5:
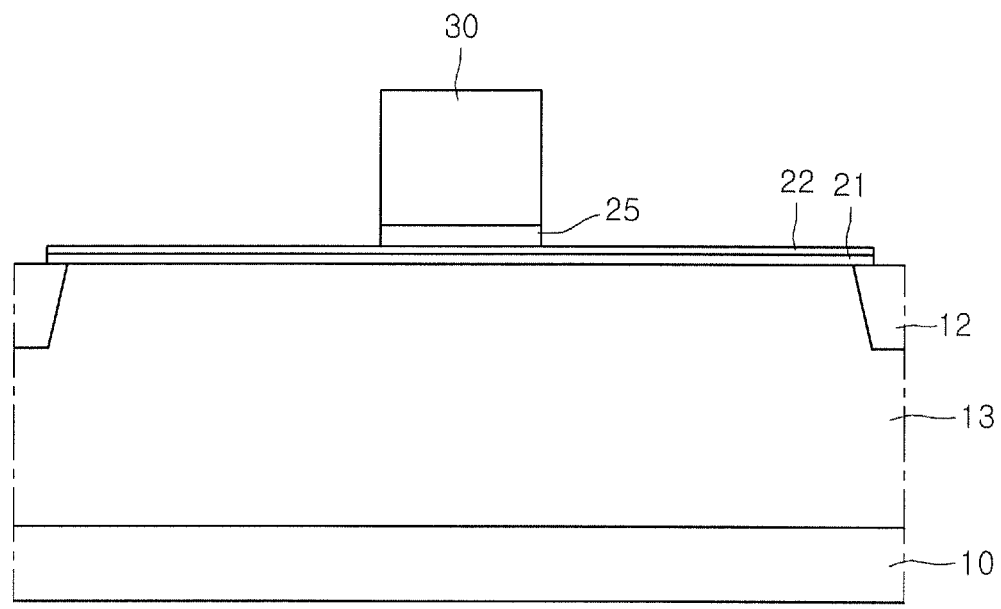

Then, as shown in FIG. 5, a part of the exposed second oxide layer pattern 23 is removed through a first etching process to form a third oxide layer pattern 25, which is the second oxide layer pattern 23 that remains at a lower portion of the mask pattern 30 after performing the first etching process.

Figure 6:
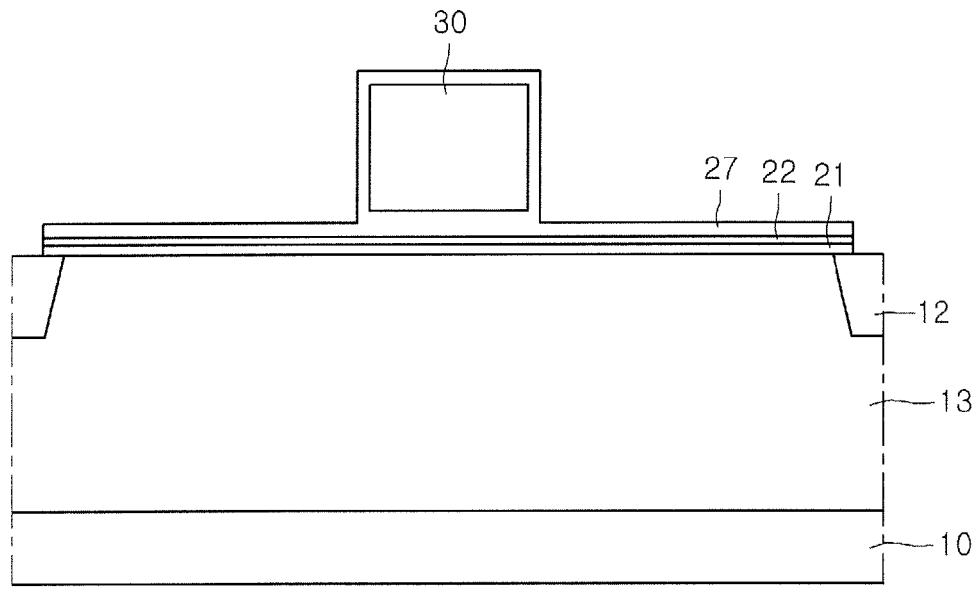

After that, as shown in FIG. 6, a third oxide layer 27 including the mask pattern 30 buried therein is formed on the semiconductor substrate 10.

An oxide layer for the third oxide layer 27 is deposited on the semiconductor substrate 10 including the third oxide layer pattern 25 and the mask pattern 30 through a CVD process and then a wet oxidation process is performed, thereby forming the third oxide layer 27 having a thickness of about 60 to 90 Å.

The third oxide layer 27 (which is formed of the oxide layer deposited on the substrate and the third oxide layer pattern 25) may surround the mask pattern 30.

Figure 7:
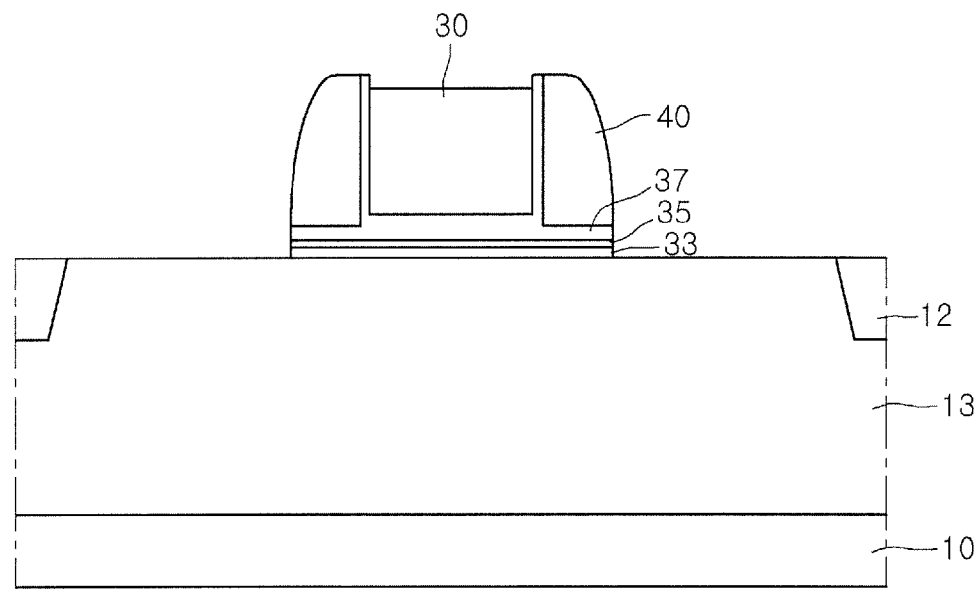

Then, referring to FIG. 7, a first polysilicon pattern 40 is formed on a sidewall of the mask pattern 30 surrounded by the third oxide layer 27.

The first polysilicon pattern 40 is formed by depositing polysilicon on the substrate and performing a second etching process after the third oxide layer 27 surrounding the mask pattern 30 has been formed.

The second etching process is an anisotropic etching process, so the first polysilicon pattern 40 can be formed on the sidewall of the mask pattern 30 in the form of a spacer without performing an additional photo process.

Since the first polysilicon pattern 40 is formed through the anisotropic etching process, the first polysilicon pattern 40 has the same size at both sides of the mask pattern 30.

In addition, the size of the first polysilicon pattern 40 can be adjusted by adjusting the size of the mask pattern 30.

The first polysilicon pattern 40 may be a memory gate. Thus, memory gates having the same size can be formed through the etching process, so device failure can be reduced and reliability of the device can be improved.

In addition, when the etching process is performed to form a gate, device failure caused by misalignment can be reduced, so that reliability of the device can be improved.

In addition, a fourth oxide layer pattern 33, a second nitride layer pattern 35 and a fifth oxide layer pattern 37 can be formed at a lower portion of the first polysilicon pattern 40 and the mask pattern 30 by removing the exposed third oxide layer 27, the first nitride layer pattern 22 and the first oxide layer 21 using the first polysilicon pattern 40 as a mask.

At this time, the third oxide layer 27 formed on the mask pattern 30 is also partially removed, so that an upper portion of the mask pattern 30 is exposed.

Figure 8:
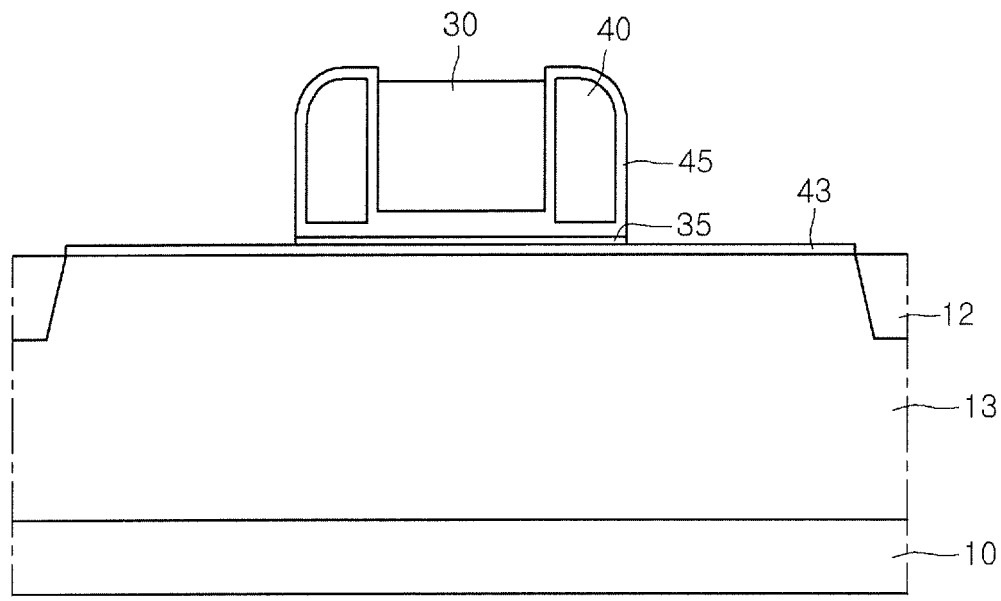

Then, as shown in FIG. 8, a second heat treatment process is performed with respect to the semiconductor substrate 10, thereby forming a sixth oxide layer pattern 43 on the semiconductor substrate 10.

When the second heat treatment process is performed to form the sixth oxide layer pattern 43, a seventh oxide layer pattern 45 surrounding the first polysilicon pattern 40 is also formed.

Figure 9:
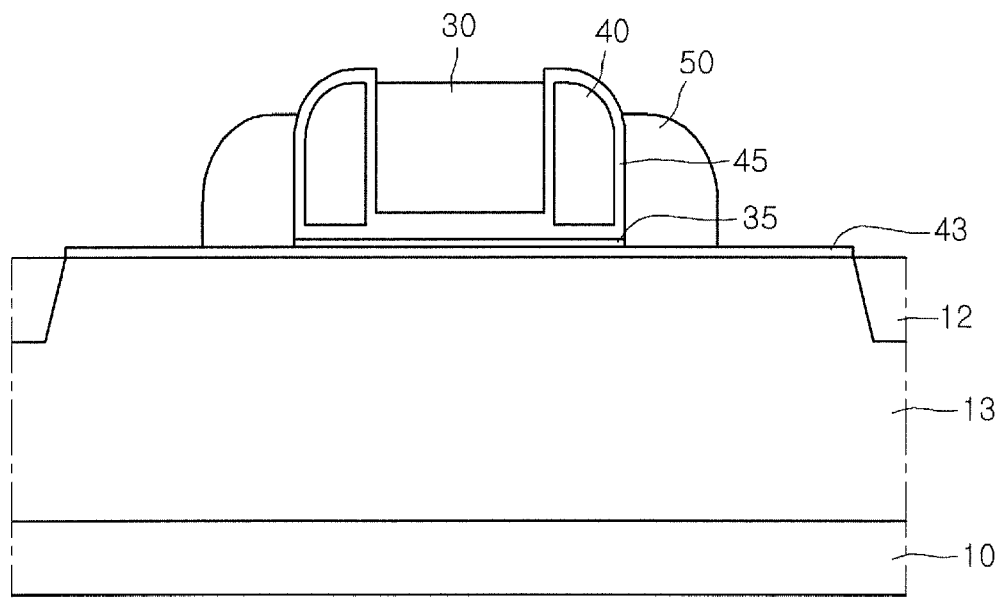

Then, as shown in FIG. 9, a second polysilicon pattern 50 is formed on the sidewall of the first polysilicon pattern 40 that is surrounded by the seventh oxide layer pattern 45.

The second polysilicon pattern 50 can be formed by performing a third etching process after forming a second polysilicon layer on the semiconductor substrate 10 including the first polysilicon pattern 40 that is surrounded by the seventh oxide layer pattern 45.

The second polysilicon layer can be formed through a CVD process to have a thickness of about 1500 to 2000 Å.

The third etching process is an anisotropic etching process, so the second polysilicon pattern 50 can be formed on the sidewall of the first polysilicon pattern 40 in the form of a spacer without performing an additional photo process.

Since the second polysilicon pattern 50 is formed through the anisotropic etching process, the second polysilicon pattern 50 has the same size at both sides of the first polysilicon pattern 40.

The second polysilicon pattern 50 is formed on the sidewall of the first polysilicon pattern 40, so that the first polysilicon pattern 40 is aligned between the second polysilicon pattern 50 and the mask pattern 30.

The second polysilicon pattern 50 may be a select gate.

In addition, since the seventh oxide layer pattern 45 surrounds the first polysilicon pattern 40, the seventh oxide layer pattern 45 is aligned between the first polysilicon pattern 40 and the second polysilicon pattern 50 and between the first polysilicon pattern 40 and the mask pattern 30.

A step difference may be formed between the first polysilicon pattern 40 and the second polysilicon pattern 50.

In addition, although not shown in the drawings, a gate can be formed at a peripheral area.

Figure 10:
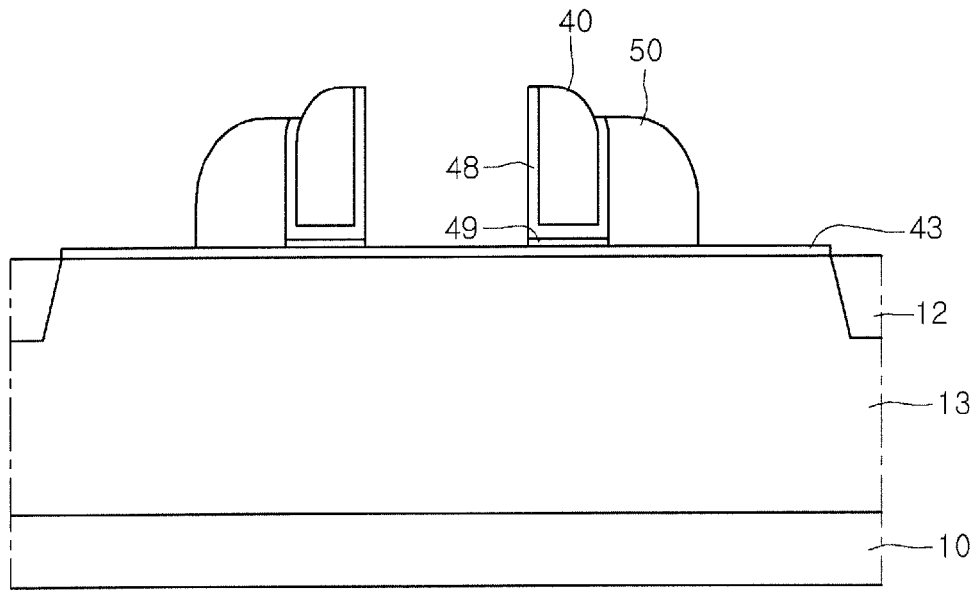

Then, as shown in FIG. 10, the mask pattern 30, a part of the seventh oxide layer pattern 45 and a part of the second nitride layer pattern 35, which are aligned below the mask pattern 30, are removed.

If the mask pattern 30 includes a nitride layer, the mask pattern 30 can be removed through a wet etching process using phosphoric acid.

After the mask pattern 30 has been removed, the seventh oxide layer pattern 45 and the second nitride layer pattern 35 aligned below the mask pattern 30 are partially removed.

When the seventh oxide layer pattern 45 is partially removed, the seventh oxide layer pattern 45 exposed to the upper portion of the first polysilicon pattern 40 can also be removed.

After the seventh oxide layer pattern 45 and the second nitride layer pattern 35 have been partially removed, an eighth oxide layer pattern 48, a third nitride layer pattern 49 and a fourth oxide layer pattern 33 are aligned below the first polysilicon pattern 40, so that the SONOS (Silicon-Oxide-Nitride-Oxide-Silicon) structure is obtained.

Figure 11:
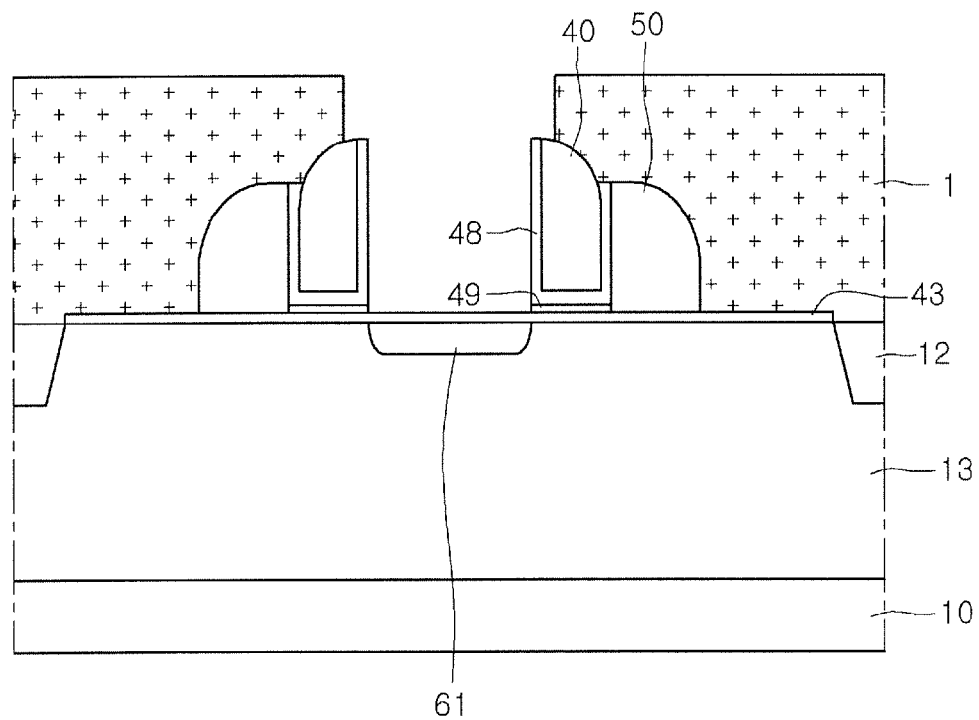

Then, as shown in FIG. 11, a first photoresist pattern 1 is formed on the semiconductor substrate 10 and a third ion implantation process is performed to form a first impurity area 61.

The first impurity area 61 is aligned between first polysilicon patterns 40 on the semiconductor substrate 10 and serves as an LDD (lightly doped drain) area.

A hot carrier injection scheme is adopted as the third ion implantation process to form the first impurity area 61. At this time, in order to maximize injection efficiency of electrons and holes, the hot carrier injection scheme is performed using V-group elements with the dose of $1 \times 10^{14}$ atoms/cm$^2$.

Figure 12:
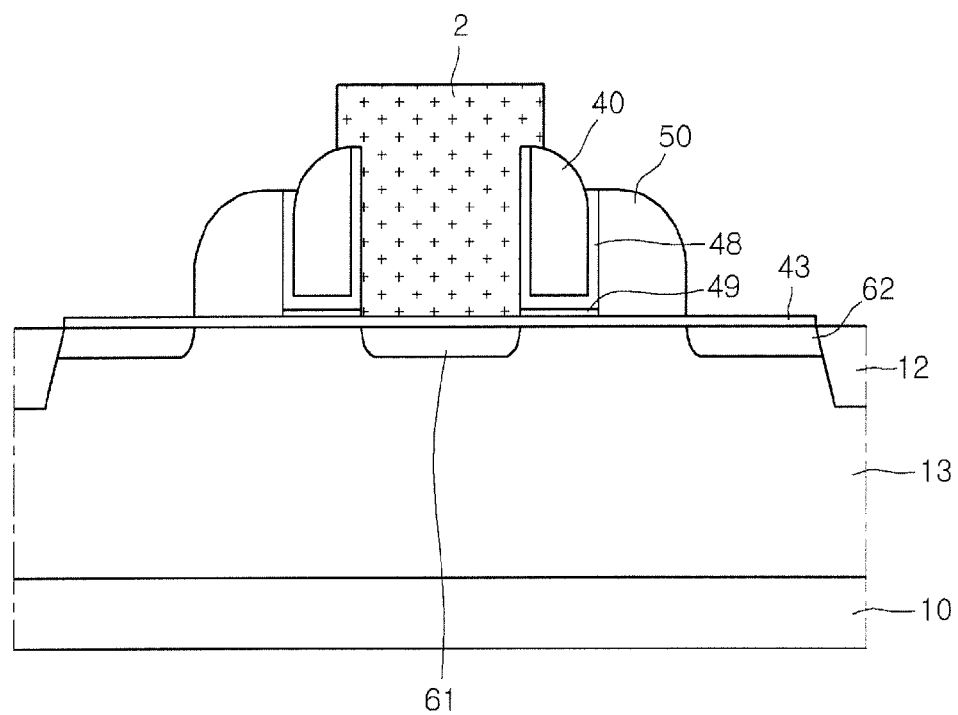

Next, as shown in FIG. 12, a second photoresist pattern 2 is formed on the semiconductor substrate 10, and a fourth ion implantation process is performed to form a second impurity area 62.

The second impurity area 62 is formed between the first polysilicon pattern 40 and the isolation layer 12 on the semiconductor substrate 10 and serves as the LDD area.

Figure 13:
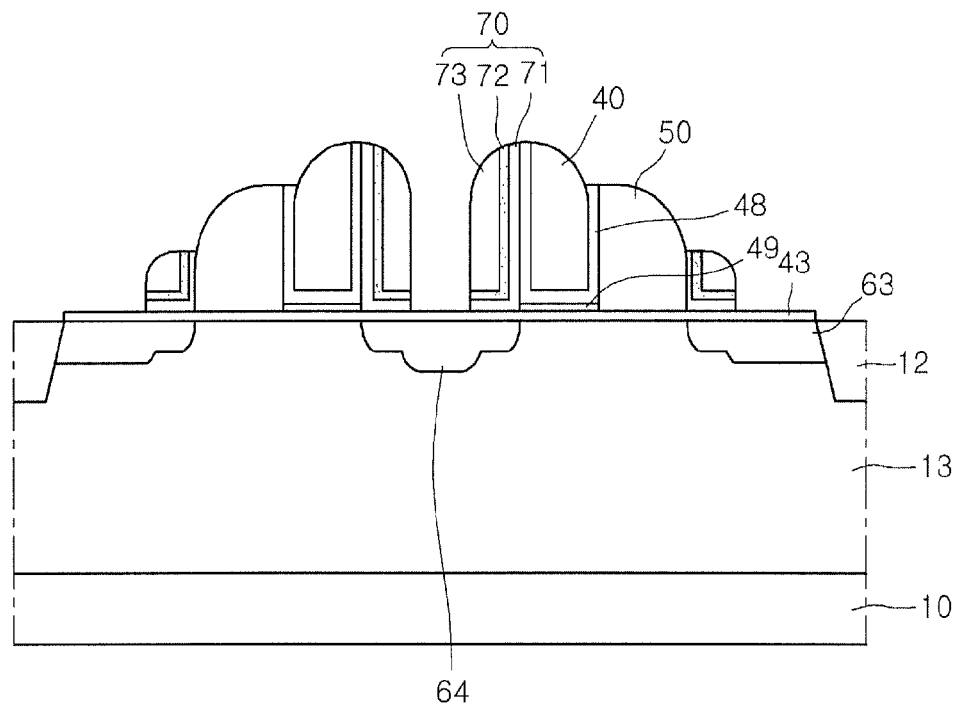

Further, as shown in FIG. 13, a spacer 70 is formed on the sidewalls of the first polysilicon pattern 40 and the second polysilicon pattern 50, thereby defining a third impurity area 63 and a fourth impurity area 64 on the semiconductor substrate 10.

In order to form the spacer 70 on the sidewalls of the first polysilicon pattern 40 and the second polysilicon pattern 50, an oxide layer 71, a nitride layer 72 and an oxide layer 73 are sequentially deposited on the semiconductor substrate 10 and then a fourth etching process is performed.

According to one embodiment, the spacer 70 has the ONO (Oxide-Nitride-Oxide) structure. However, embodiments are not limited thereto. For instance, the spacer 70 may have an ON (Oxide-Nitride) structure.

In addition, the third and fourth impurity areas 63 and 64 can be formed by using the spacer 70 as a mask.

The third impurity area 63 may serve as a source area, and the fourth impurity area 64 may serve as a drain area.

Figure 14:
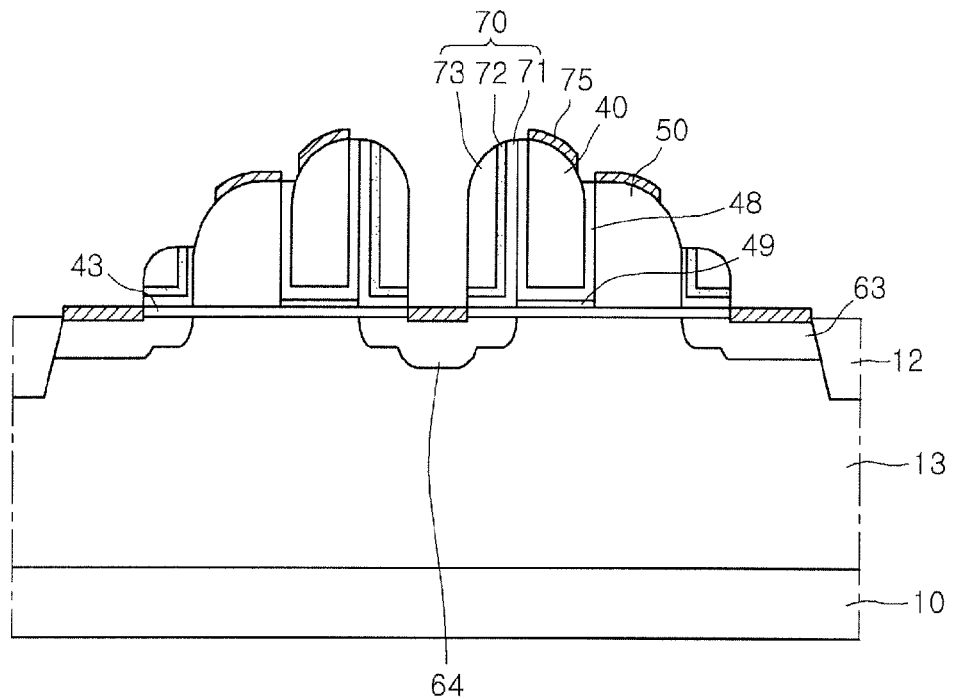

Then, as shown in FIG. 14, a silicide layer 75 is formed on the top of the first polysilicon pattern 40, the top of the second polysilicon pattern 50 and the exposed portion of the semiconductor substrate 10 having the impurity areas.

The silicide layer 75 can be formed by performing a salicide process with respect to the semiconductor substrate 10 using cobalt (Co). The silicide layer is formed on an area where contacts will be formed later.

In order to form the silicide layer 75, the sixth oxide layer pattern 43 (see FIG. 13) formed on the tops of the third and fourth impurity areas 63 and 64 is partially removed and then the salicide process is performed.

Figure 15:
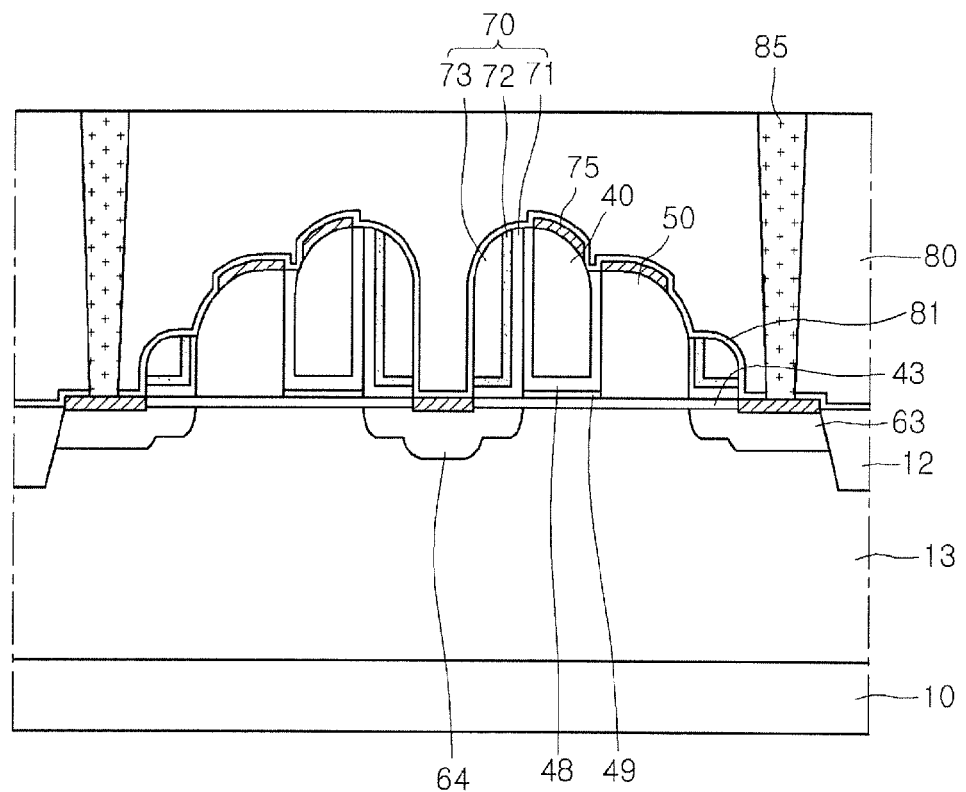

In addition, as shown in FIG. 15, a fifth nitride layer 81 and an interlayer dielectric layer 80 are formed on the semiconductor substrate 10 and contacts 85 are formed in the interlayer dielectric layer 80.

The fifth nitride layer 81 protects devices aligned below the fifth nitride layer 81 and can include a silicon nitride (SiN) layer.

The flash memory device according to the above described embodiments operates as follows.

For the purpose of program operation of the flash memory device, bias voltage can be applied as follows.

First, bias voltage corresponding to threshold voltage for forming a channel in the semiconductor substrate 10 is applied to the second polysilicon pattern 50 serving as the select gate, and bias voltage is applied to the fourth impurity area 64 serving as the source area such that electrons serving as hot carriers can be injected into the first polysilicon pattern 40 serving as the memory gate.

At this time, a bias voltage of about 4 V to 6 V is applied to the fourth impurity area 64 serving as the source area and a bias voltage of 0 V is applied to the third impurity area serving as the drain area and the semiconductor substrate 10.

In addition, a bias voltage of about 9 V to 10 V is applied to the first polysilicon pattern serving as the memory gate, so that electrons are injected into the memory gate.

For the purpose of erase operation of the flash memory device, bias voltage can be applied as follows.

First, bias voltage is applied to the fourth impurity area 64 serving as the source area such that BTBT (band to band tunneling) can be achieved.

That is, the bias voltage is applied to the fourth impurity area 64 such that many EHPs (electron-hole pairs) can be formed in the fourth impurity area 64, and a negative (−) bias voltage is applied to the first polysilicon pattern 40. Thus, holes are trapped in the third nitride layer pattern 49 so that the holes are erased.

At this time, a bias voltage of 0 V is applied to the second polysilicon pattern 50 serving as the select gate, the third impurity area 63 serving as the drain area, and the semiconductor substrate 10.

For the purpose of read operation of the flash memory device, bias voltage can be applied as follows.

First, bias voltage is applied to the first polysilicon pattern 40 serving as the memory gate and the second polysilicon pattern 50 serving as the select gate, and a bias voltage of 0V is applied to the fourth impurity area 64 serving as the source area and the semiconductor substrate 10.

As the bias voltage is applied to the third impurity area 63 serving as the drain area, current may flow. The current rarely flows during the program operation, and much current may flow during the erase operation, so that the program operation and the erase operation can be recognized.

As described above, according to the method of manufacturing the flash memory device of an embodiment, the gates having the spacer shape can be formed without performing an additional photo process, and the gates are formed through an anisotropic etching process so that the gates have the same size.

Therefore, the memory gates having the same size can be formed through the etching process, so that device failure can be reduced and reliability of the device can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a flash memory device, the method comprising:

forming a first oxide layer on a semiconductor substrate, forming a first nitride layer pattern on the first oxide layer, and forming a second oxide layer pattern having a mask pattern buried therein on the first nitride layer pattern;

forming a first polysilicon pattern on a sidewall of the mask pattern that is surrounded by the second oxide layer pattern;

performing a first etching process with respect to the semiconductor substrate having the first polysilicon pattern, the first oxide layer, the first nitride layer pattern, and the second oxide layer pattern such that a third oxide layer pattern, a second nitride layer pattern and a fourth oxide layer pattern are formed at lower portions of the first polysilicon pattern and the mask pattern;

forming a fifth oxide layer pattern surrounding the first polysilicon pattern and forming a second polysilicon pattern on a sidewall of the fifth oxide layer pattern in a form of a spacer; and removing the mask pattern and parts of the third oxide layer pattern and the second nitride layer pattern at the lower portion of the mask pattern.

2. The method of manufacturing a flash memory device according to claim 1, wherein forming a second oxide layer pattern having a mask pattern buried therein on the first nitride layer pattern comprises:

forming an initial oxide layer on the nitride layer pattern;

forming the mask pattern on the initial oxide layer;

etching the initial oxide layer using the mask pattern as an etch mask; and forming a secondary oxide layer on the substrate including on the mask pattern, thereby burying the mask pattern within the second oxide layer pattern formed of the initial oxide layer and the secondary oxide layer.

3. The method of manufacturing a flash memory device according to claim 1, wherein forming the first polysilicon pattern on the sidewall of the mask pattern that is surrounded by the second oxide layer pattern comprises:

forming a first polysilicon layer on the second oxide layer pattern having the mask pattern buried therein; and performing a second etching process with respect to the semiconductor substrate including the first polysilicon layer such that a first polysilicon pattern is formed on the sidewall of the mask pattern that is surrounded by the second oxide layer pattern, wherein the second etching process includes an anisotropic etching process.

4. The method of manufacturing a flash memory device according to claim 1, wherein the fifth oxide layer pattern is formed by performing a first heat treatment process with respect to the semiconductor substrate.

5. The method of manufacturing a flash memory device according to claim 1, wherein forming the second polysilicon pattern on the sidewall of the fifth oxide layer pattern comprises:

forming a second polysilicon layer on the semiconductor substrate including the fifth oxide layer pattern surrounding the first polysilicon pattern; and performing a third etching process on the second polysilicon layer, wherein the third etching process includes an anisotropic etching process.

6. The method of manufacturing a flash memory device according to claim 1, wherein a plurality of first polysilicon patterns each having same sizes is formed on the sidewalls of the mask pattern.

7. The method of manufacturing a flash memory device according to claim 1, wherein a plurality of second polysilicon patterns each having same sizes is formed on the sidewalls of the fifth oxide layer pattern.

8. The method of manufacturing a flash memory device according to claim 1, further comprising: adjusting a size of the first polysilicon pattern by selecting a size of the mask pattern.

9. The method of manufacturing a flash memory device according to claim 1, wherein the first etching process exposes the semiconductor substrate.

10. The method of manufacturing a flash memory device according to claim 1, wherein the fifth oxide layer pattern is partially removed when removing the parts of the third oxide layer pattern and the second nitride layer pattern.

11. The method of manufacturing a flash memory device according to claim 1, wherein the fifth oxide layer pattern is aligned between the first polysilicon pattern and the second polysilicon pattern and between the mask pattern and the first polysilicon pattern.

* * * * *